United States Patent
Wong

(10) Patent No.: US 6,821,879 B2
(45) Date of Patent: Nov. 23, 2004

(54) COPPER INTERCONNECT BY IMMERSION/ELECTROLESS PLATING IN DUAL DAMASCENE PROCESS

(75) Inventor: Kaiser H. Wong, Torrance, CA (US)

(73) Assignee: Xerox Corporation, Stamford, CT (US)

( * ) Notice: Subject to any disclaimer, the term of this patent is extended or adjusted under 35 U.S.C. 154(b) by 105 days.

(21) Appl. No.: 10/284,538

(22) Filed: Oct. 30, 2002

(65) Prior Publication Data

US 2004/0087148 A1 May 6, 2004

(51) Int. Cl.[7] .......................................... H01L 21/4763
(52) U.S. Cl. .................. 438/618; 438/597; 438/620; 438/622; 438/627; 438/637; 438/642; 438/643; 438/647; 438/650; 438/651; 438/652; 438/653; 438/657; 438/660; 438/672; 438/675; 438/678; 438/686; 438/687
(58) Field of Search ................................ 438/597, 618, 438/620, 622, 625, 627, 629, 631, 634, 637, 642–643, 647, 650–653, 655, 657, 660, 672, 675, 678, 680, 682, 684, 686, 687, 927

(56) References Cited

U.S. PATENT DOCUMENTS

| | | | |
|---|---|---|---|
| 5,391,517 A | 2/1995 | Gelatos et al. | 437/190 |
| 5,674,787 A | 10/1997 | Zhao et al. | 437/230 |
| 5,891,513 A | 4/1999 | Dubin et al. | 427/98 |

*Primary Examiner*—Richard Elms
*Assistant Examiner*—Beth E. Owens
(74) *Attorney, Agent, or Firm*—Oliff & Berridge, PLC

(57) ABSTRACT

The invention is directed to a fabrication method of copper interconnects using dual damascene processing. Using silicon to provide an active surface, palladium can be selectively deposited on silicon by an immersion plating technique. After palladium deposition (about 1000 Å thick), either a layer of cobalt phosphorus or alloy cobalt/nickel phosphorus or nickel phosphorus is deposited on the palladium layer using an electroless plating technique. This cobalt phosphorus, cobalt/nickel phosphorus alloy, or nickel phosphorus layer serves as a copper diffusion barrier. The via and trenches are filled with copper by an electroless copper plating method and CMP is used to remove the excess copper and planarize-/-polish the copper/dielectric surface.

13 Claims, 5 Drawing Sheets

COPPER INTERCONNECT BY IMMERSION/ELECTROLESS PLATING IN DUAL DAMASCENE PROCESS

BACKGROUND OF THE INVENTION

1. Field of Invention

The invention relates to interconnects for a semiconductor wafer using immersion/electroless plating in a dual damascene process.

2. Description of Related Art

In the manufacture of devices on a semiconductor wafer, it is now the practice to fabricate multiple levels of conductive (typically metal) layers above a substrate. The multiple metallization layers are employed in order to accommodate higher densities as device dimensions shrink well below one micron design rules. Thus, semiconductor "chips" having three and four levels of metallization are becoming more prevalent as device geometries shrink to sub-micron levels.

One common metal used for forming metal lines (also referred to as wiring) on a wafer is aluminum. Aluminum is used because it is relatively inexpensive compared to other conductive materials, it has low resistivity and is also relatively easy to etch. Aluminum is also used as a material for forming interconnections in vias to connect the different metal layers. However, as the size of via/contact holes is scaled down to a sub-micron region, the step coverage problem appears, which has led to reliability problems when using aluminum to form the interconnection between different wiring layers. The poor step coverage in the sub-micron via/contact holes result in high current density and enhance the electromigration.

One material which has received considerable attention as a replacement material for VLSI interconnect metallizations is copper. Since copper has higher resistance to electromigration and lower resistivity than aluminum, it is a more preferred material for interconnect (plugs and wiring) formation than aluminum. However, one serious disadvantage of using copper metallization is that it is difficult to etch. Thus, where it was relatively easier to etch aluminum after deposition to form wiring lines or plugs (both wiring and plugs are referred to as interconnects), substantial additional cost and time are now required to etch copper.

One typical practice in the art is to fabricate copper plugs and wiring by inlaid (Damascene) structures by employing CMP. Dual Damascene processing eliminates not only the need for metal etch (which is increasingly challenging in aluminum interconnects and nearly impossible with copper), but also the need for dielectric gap fill (another challenging process). This technique involves the creation of interconnect lines by first etching a trench or canal in a planar dielectric layer, and then filling that trench with metal, such as aluminum or copper. In dual damascene processing, a second level is involved where a series of holes (i.e., contacts or vias) are etched and filled in addition to the trench. After filling, the metal and dielectric are planarized by chemical-mechanical polishing (CMP). The challenge associated with copper interconnect is how to deposit a thin layer of material on the trench and via as diffusion barrier to prevent copper diffusion. The trick is to keep the diffusion barrier thin so that it does not negatively impact the resistivity of the plug, while still acting as a good barrier to diffusion. A variety of techniques have been developed to deposit copper, including chemical vapor deposition (CVD), plasma vapor deposition (PVD), sputtering, electroplating, and electroless plating. After copper deposition, a chemical mechanical polishing (CMP) process is used to planarize/polish the metal/dielectric surface.

SUMMARY OF THE INVENTION

The invention is directed to a fabrication method of copper interconnects using dual damascene processing. Using silicon or polysilicon to provide an active surface, palladium can be selectively deposited on silicon by immersion plating technique. After palladium deposition (about 1000 Å thick), either a layer of cobalt phosphorus or alloy cobalt/nickel phosphorus or nickel phosphorus is deposited on the palladium layer using the electroless plating technique. This cobalt phosphorus, cobalt/nickel phosphorus alloy, or nickel phosphorus layer serves as a copper diffusion barrier. The via and trench are filled up with copper by an electroless copper plating method and CMP is used to remove the excess copper and planarize/polish the copper/dielectric surface.

These together with other objects of the invention, along with the various features of novelty which characterize the invention, are pointed out with particularity in the claims annexed to and forming a part of this disclosure. For a better understanding of the invention, its operating advantages and the specific objects obtained by its uses, reference should be made to the accompanying drawings and descriptive matter in which there are illustrated preferred embodiments of the invention.

DETAILED DESCRIPTION OF PREFERRED EMBODIMENTS

This invention describes a fabrication method of copper interconnects using dual damascene processing. Using doped amorphous silicon or polysilicon to provide an active surface, palladium can be selectively deposited on silicon by immersion plating techniques. This novel deposition technique was described in U.S. Pat. No. 5,358,907 entitled "Method of Electrolessly Depositing Metals on a Silicon Substrate By Immersing the Substrate in Hydrofluoric Acid Containing a Buffered Metal Salt Solution" by Kaiser Wong. After palladium deposition (about 1000 Å thick), either a layer of cobalt phosphorus or the alloy cobalt/nickel phosphorus or nickel phosphorus is deposited on the palladium layer using an electroless plating technique. This cobalt phosphorus, cobalt/nickel phosphorus alloy, or nickel phosphorus layer serves as a copper diffusion barrier. The via and trench are filled up with copper by an electroless copper plating method and CMP is used to remove excess copper and planarize/polish the copper/dielectric surface. This fabrication process is illustrated and more fully described below with reference to FIGS. 1 to 9.

Figure 1:
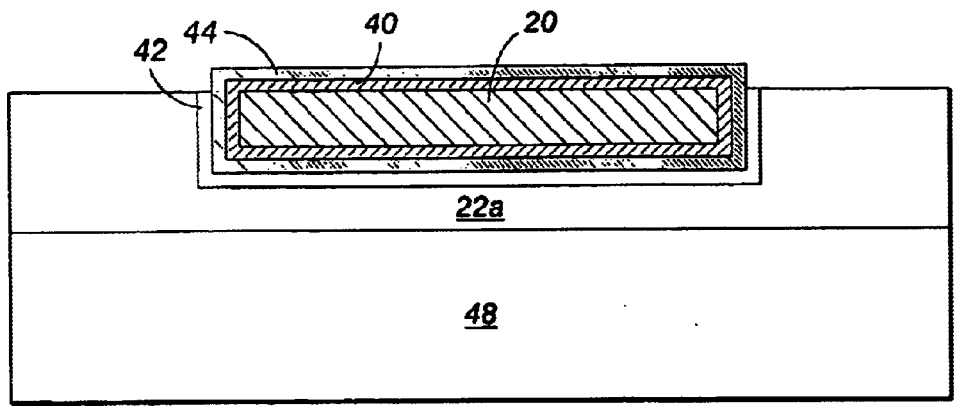
FIGS. 1 through 9 are schematic illustrations of side elevation views of layers of a wafer fabricated in accordance with the process of the present invention.
Figure 2:
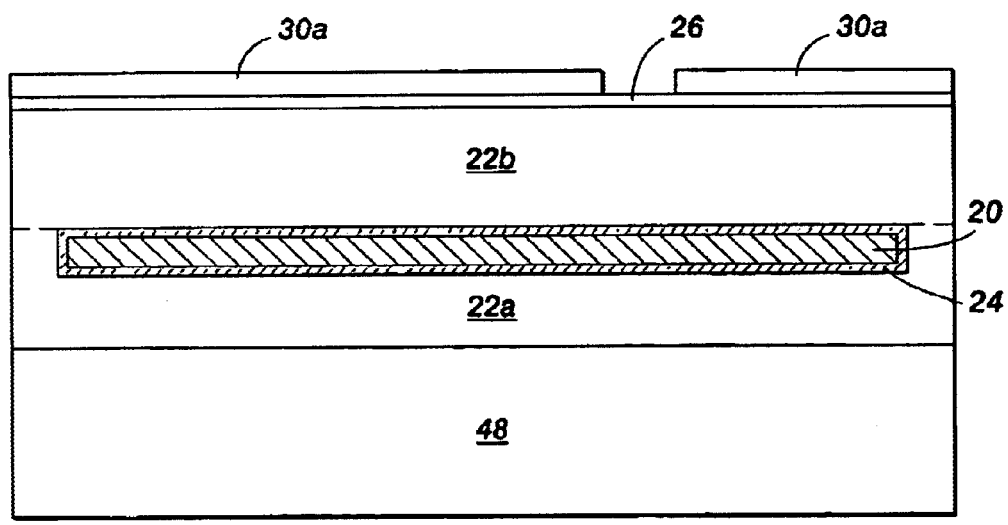

Reference is now made to FIG. 1 wherein there is shown a semiconductor silicon substrate 48 coated with a first layer of silicon oxide 22a. An encapsulated copper diffusion barrier is formed in a trench formed in silicon oxide layer 22a. The encapsulated copper diffusion barrier is formed by depositing a layer of doped amorphous silicon or polysilicon 42, a layer of palladium 44, and a layer that includes one at least cobalt phosphorus, cobalt/nickel phosphorus or nickel phosphorus 40, forming a metal conductor on the cobalt phosphorus, cobalt/nickel phosphorus, or nickel phosphorus, and encapsulating the metal conductor with an additional layer of at least one of cobalt phosphorus, cobalt/nickel phosphorus, or nickel phosphorus, and an additional layer of palladium. CMP is employed to planarize the surface of the encapsulated copper diffusion barrier.

Figure 3:
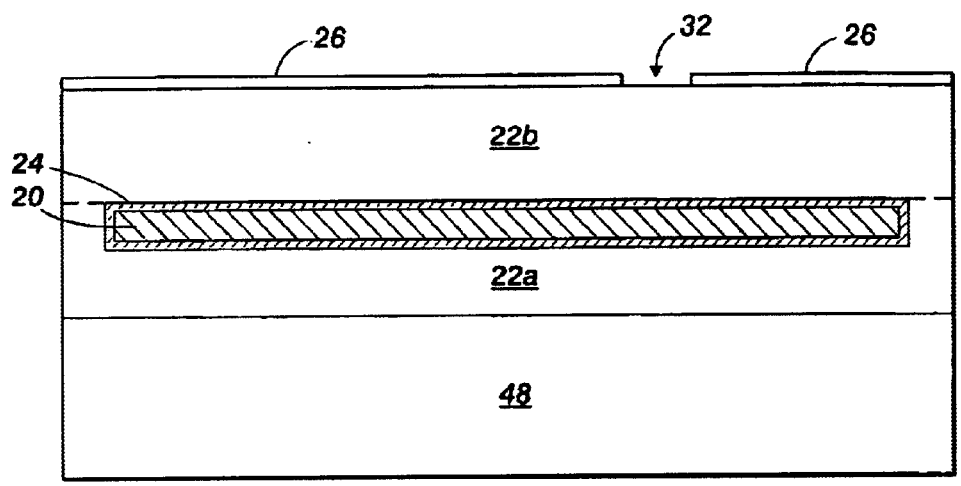
Figure 4:
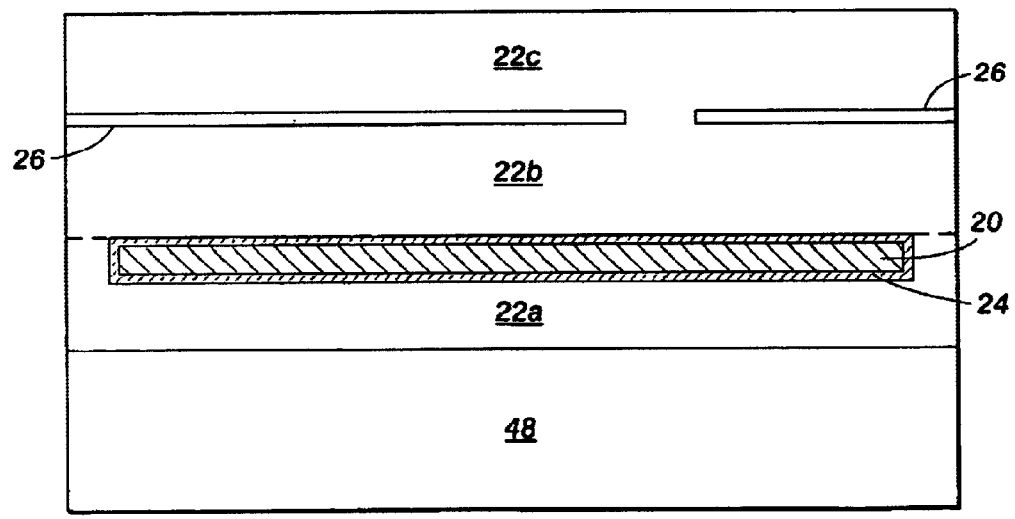
Figure 5:
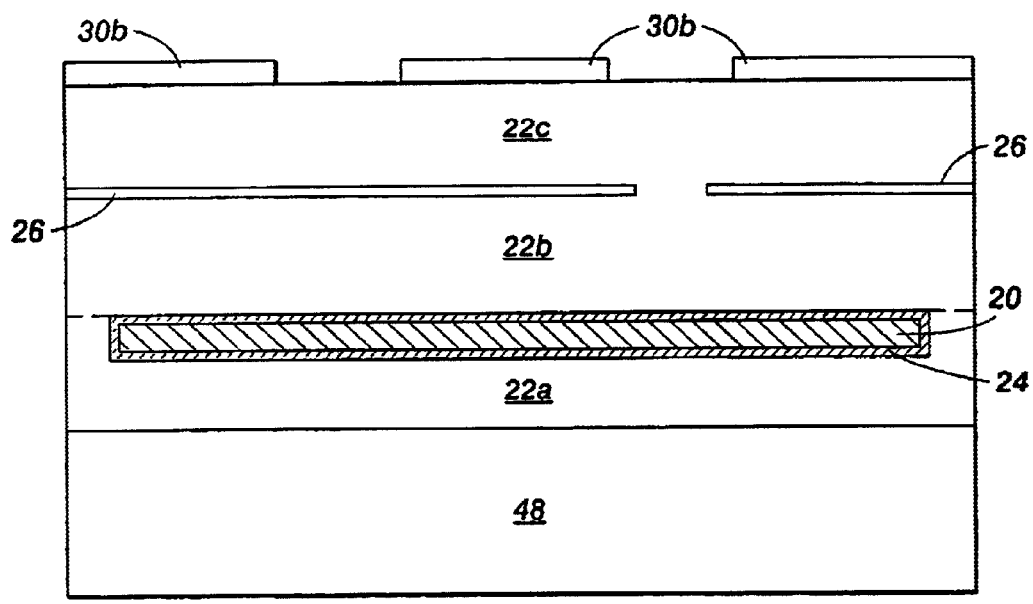
Figure 6:
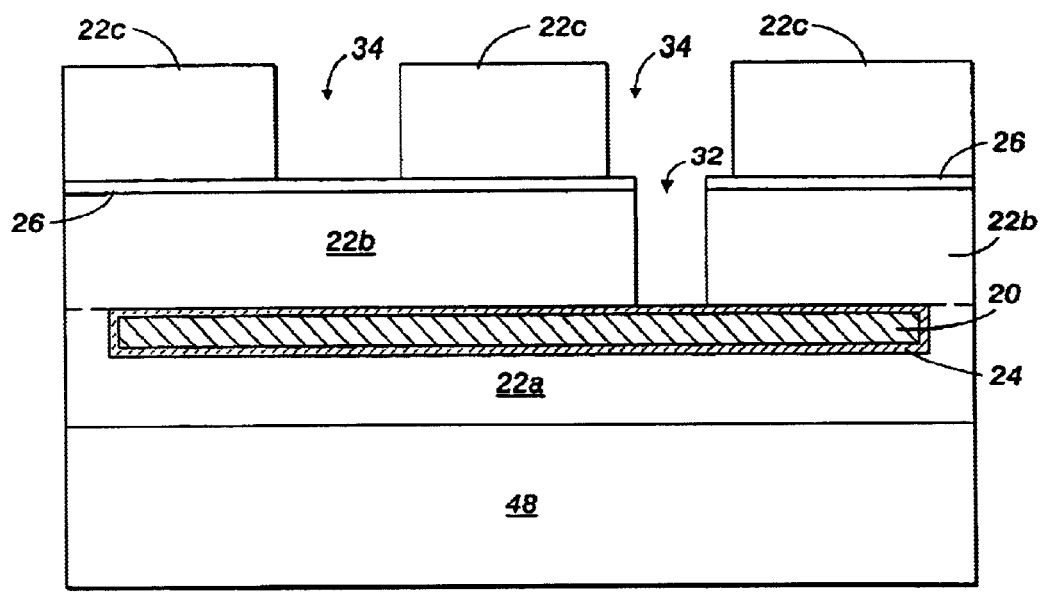

Referring once again to FIG. 2, insulator layer (silicon oxide) 226 with silicon nitride 26 acting as an etch stop layer is deposited thereon and a first photoresist pattern 30a is next deposited on the wafer of FIG. 1. Next, the exposed silicon nitride is etched away and the photoresist is stripped to form the via pattern 32 and an additional silicon oxide insulator layer 22c is deposited, as shown in FIGS. 3 and 4. As shown in FIG. 5 a second patterned photoresist 30b is deposited for forming the interconnect via and trenches. Next, the silicon oxide layers 22b and 22c are etched (according to the photoresist patterns) to form the trenches 34 and via 32 and the remaining photoresist stripped away as shown in FIG. 6.

Figure 7:
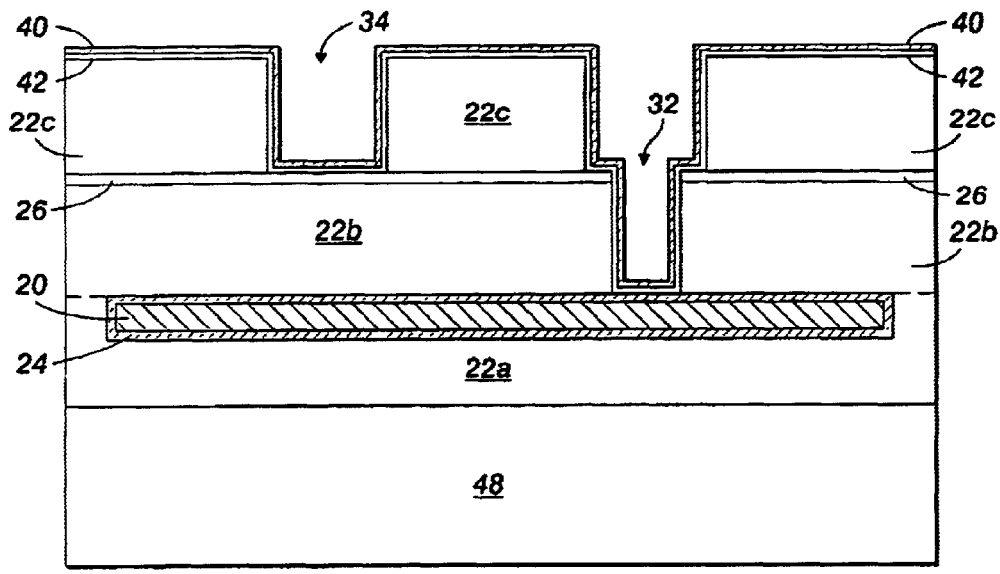
Figure 8:
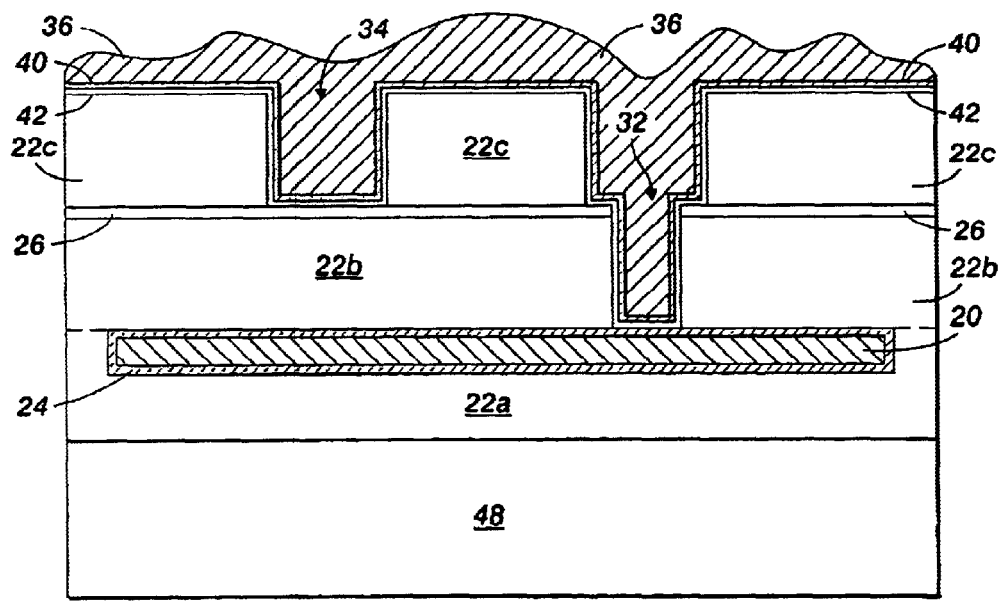
Figure 9:
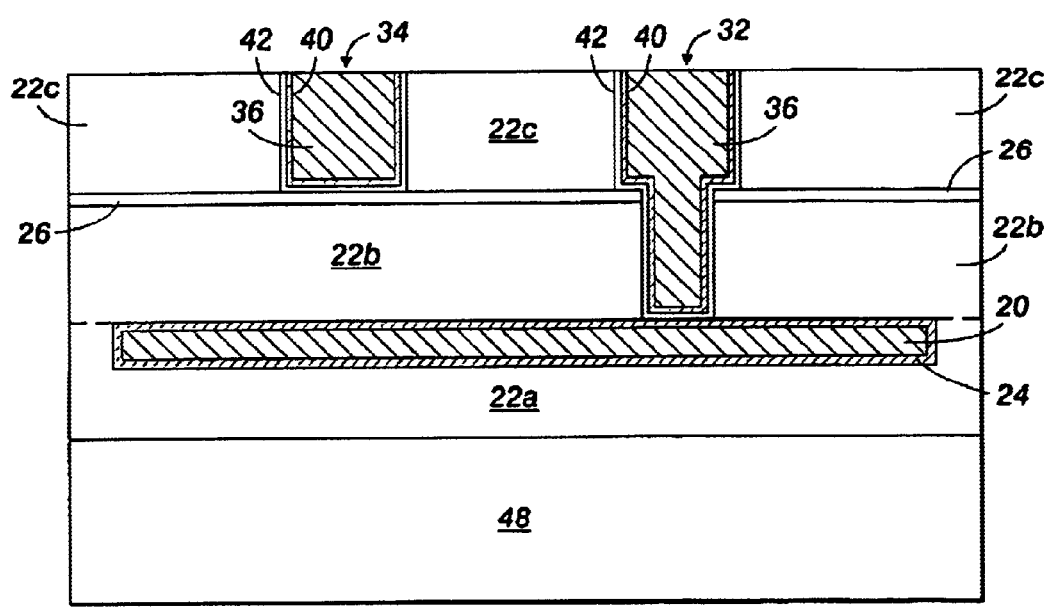

Referring now to FIG. 7, a thin layer (1000 Å) of doped amorphous silicon or polysilicon layer 42 is deposited by chemical vapor deposition (CVD) followed by a palladium layer (1000 Å) 40 by electroless plating. Copper 36 is next deposited to fill up the via 32 and trenches 34 by electroless copper plating, as shown in FIG. 8. Lastly, using chemical mechanical polishing (CMP) excess copper 36 and palladium 40 and the doped amorphous silicon or polysilicon layer 42 is removed and the copper/oxide surface is planarized. The above process may be repeated for multilayer interconnections.

It should be noted that after annealing at 400° C. the amount of the interdiffused copper into a 1000 Å thick layer of CoP, or CoNiP, or NiP is less than 1 atomic percentage. The contact resistivity is in the $10^{-8}$ ohms range for NiP. $Pd_2Si$ (palladium silicide) is formed during thermal treatment. There is also observed low contact resistance of the $Pd_2Si/Si$ junction. The copper obtained from electroless plating has an electrical resistivity of about 1.8 u ohms cm, much lower than 2.5 u ohms cm of resistivity of aluminum.

This invention proposes a method of fabricating copper interconnect in VLSI and ULSI metallization. It is appealing because of the low cost of the equipment and materials and the high throughput of the process. Immersion and electroless plating techniques employed in this invention are highly selective, depositing the desired metallization to the desired patterns. They have excellent step coverage and good via/trench filling capability.

It should further be noted that numerous changes in details of construction and the combination and arrangement of elements may be resorted to without departing from the true spirit and scope of the invention as hereinafter claimed.

What is claimed is:

1. A method of forming an interconnect for a semiconductor on a substrate using a dual damascene process, comprising:

forming a first layer of silicon oxide on the substrate; and forming a trench in the first layer of silicon oxide in which to form an encapsulated copper diffusion barrier, the formation of the copper diffusion barrier comprising:

forming a first layer comprised of one of at least a doped amorphous silicon and polysilicon on the trench surface;

forming a first layer of palladium on the first layer of the one of at least the doped amorphous silicon and polysilicon;

forming a first layer comprised of one of at least a cobalt phosphorus, an alloy of cobalt/nickel phosphorus and nickel phosphorus on the first layer of palladium; and forming a metal conductor on the first layer comprised of one of at least a cobalt phosphorus, an alloy of cobalt/nickel phosphorus or nickel phosphorous;

encapsulating the metal conductor with a second subsequent layer of the one of at least the cobalt phosphorus, alloy of cobalt/nickel phosphorus or nickel phosphorous layer, followed by a second layer of palladium; and forming a second layer of silicon oxide on the first layer of silicon oxide and the encapsulated copper diffusion barrier.

2. The method of claim 1, further comprising:

depositing a layer of silicon nitride on the second silicon layer;

depositing a first photoresist pattern on the silicon nitride layer; and etching away any exposed silicon nitride using the first photoresist pattern.

3. The method of claim 2, further comprising removing the first photoresist pattern to form a mask for a via.

4. The method of claim 3, further comprising forming a third layer of silicon oxide on the patterned silicon layer.

5. The method of claim 4, further comprising depositing a second photoresist pattern on the third layer of silicon oxide that defines interconnect trenches.

6. The method of claim 5, further comprising:

using the second photoresist pattern to form a trench by etching the third silicon oxide layer to the silicon nitride layer;

using the second photoresist pattern to form a trench and a via by etching the third and second silicon layers to the encapsulated copper diffusion barrier; and removing any remaining part of the second photoresist pattern from the third silicon oxide layer.

7. The method of claim 6, comprising:

forming a second layer of one of at least a doped amorphous silicon and polysilcon to be 1000 Å on the surface of the third silicon oxide layer and the surfaces of the formed via and trenches; and forming a third layer of palladium approximately 1000 Å on the third layer of the one of at least the doped amorphous silicon and polysilicon.

8. The method of claim 7, further comprising forming the second layer of the one of at least doped amorphous silicon and polysilicon by chemical vapor deposition.

9. The method of claim 8, further comprising:

depositing copper on the third palladium layer to fill up the via and the interconnect trenches; and forming the interconnect by removing excess copper, the third palladium layer and the third layer of the one of at least doped amorphous silicon and polysilicon from the surface of the third silicon oxide layer.

10. The method of claim 9, further comprising the amount of interdiffused copper at 400° C. into a 1000 Å thick layer of cobalt phosphorus, or cobalt/nickel phosphorus, or nickel phosphorus is less than 1 atomic percent.

11. The method of claim 10, further comprising the third palladium layer becoming a layer of palladium silicide during a thermal treatment wherein a device comprised of nickel phosphorus has a contact resistivity that is in the range of $10^{-8}$ ohms.

12. The method of claim 9, further comprising the copper deposition is performed using an electroless copper plating process.

13. The method of claim 9, further comprising removing the excess copper by a chemical-mechanical polishing process.

* * * * *